(12) United States Patent
Linder et al.

(10) Patent No.: US 10,247,769 B2
(45) Date of Patent: Apr. 2, 2019

(54) MEASURING INDIVIDUAL DEVICE DEGRADATION IN CMOS CIRCUITS

(71) Applicant: INTERNATIONAL BUSINESS MACHINES CORPORATION, Armonk, NY (US)

(72) Inventors: Barry P. Linder, Hastings-on-Hudson, NY (US); Keith A. Jenkins, Sleepy Hollow, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 533 days.

(21) Appl. No.: 14/843,280

(22) Filed: Sep. 2, 2015

(65) Prior Publication Data

US 2017/0059644 A1    Mar. 2, 2017

(51) Int. Cl.
*G01R 31/26* (2014.01)
*G01R 31/28* (2006.01)

(52) U.S. Cl.
CPC ..... *G01R 31/2621* (2013.01); *G01R 31/2642* (2013.01); *G01R 31/2884* (2013.01)

(58) Field of Classification Search
CPC ............ G01R 31/2621; G01R 31/2642; G01R 31/2884
USPC ........................................................ 324/750
See application file for complete search history.

(56) References Cited

U.S. PATENT DOCUMENTS

| | | |
|---|---|---|
| 6,476,632 B1 | 11/2002 | La Rosa et al. |
| 6,731,179 B2 | 5/2004 | Abadeer et al. |
| 7,495,519 B2 | 2/2009 | Kim et al. |
| 7,642,864 B2 | 1/2010 | Chuang et al. |
| 7,808,266 B2 | 10/2010 | Marsall et al. |
| 8,283,941 B2 | 10/2012 | Kuo et al. |
| 8,456,247 B2 | 6/2013 | Kim et al. |
| 8,587,383 B2 | 11/2013 | Brochu, Jr. et al. |
| 8,676,516 B2 | 3/2014 | Gebara et al. |
| 8,692,571 B2 | 4/2014 | Lai et al. |
| 9,494,641 B2 | 11/2016 | Smith et al. |

(Continued)

FOREIGN PATENT DOCUMENTS

JP         05297077 A    11/1993

OTHER PUBLICATIONS

Disclosed Anonymously, "A Method and System for Determining Performance Degradation due to Bias Temperature Instability using Interleaved Ring Oscillators," IPCOM000234584D, IP.com Electronic Publication, Jan. 20, 2014, pp. 1-3.

(Continued)

*Primary Examiner* — Melissa J Koval
*Assistant Examiner* — Courtney McDonnough
(74) *Attorney, Agent, or Firm* — Tutunjian & Bitetto, P.C.; Jennifer R. Davis (57) ABSTRACT

Methods and systems for measuring degradation includes measuring an initial electrical characteristic of a test device in a ring oscillator that includes multiple oscillator stages, each having a delay stage and one or more fan-out devices, and a test stage having a delay stage and the test device. The ring oscillator is operated for a period of time. The electrical characteristic of the test device is measured after operating the ring oscillator. A level of degradation in the test device is determined using a processor based on the measurements of the electrical characteristic of the test device.

20 Claims, 7 Drawing Sheets

(56) References Cited

U.S. PATENT DOCUMENTS

| | | |
|---|---|---|
| 2003/0042926 A1 | 3/2003 | Rost et al. |
| 2003/0233624 A1* | 12/2003 | Reddy .................. G01R 31/287 716/111 |
| 2005/0212543 A1* | 9/2005 | Suzuki ............... G01R 31/2856 324/750.3 |
| 2011/0090015 A1 | 4/2011 | Sumita et al. |
| 2013/0285685 A1 | 10/2013 | Bowman et al. |

OTHER PUBLICATIONS

Disclosed Anonymously, "Circuit and Methodology for Stressing Transistors for NBTI and TDDB and Differentiating the Circuit Effects of NBTI and TDDB," IPCOM000198592D, IP.com Electronic Publication, Aug. 10, 2010, pp. 1-6.

J. Keane et al., "An All-In-One Silicon Odometer for Separately Monitoring HCI, BTI, and TDDB," IEEE Journal of Solid-State Circuits, Apr. 2010, pp. 817-829, vol. 45, Issue: 4.

P. Weckx et al., "Implications of BTI-Induced Time-Dependent Statistics on Yield Estimation of Digital Circuits," Electron Devices, IEEE Transactions, Mar. 2014, pp. 666-673, vol. 61, Issue: 3.

P. Lu et al., "A built-in BTI monitor for long-term data collection in IBM microprocessors," Reliability Physics Symposium (IRPS), 2013 IEEE International, Apr. 2013, pp. 4A.1.1-4A.1.6.

H. Reisinger et al., "The statistical analysis of individual defects constituting NBTI and its implications for modeling DC- and AC-stress," Reliability Physics Symposium (IRPS), 2010 IEEE International, May 2010, pp. 7-15.

\* cited by examiner

MEASURING INDIVIDUAL DEVICE DEGRADATION IN CMOS CIRCUITS

BACKGROUND

Technical Field

The present invention relates to measuring device degradation and, more particularly, to measuring degradation characteristics of individual devices when a circuit degrades from normal or stressed operation.

Description of the Related Art

Degradation of the electrical properties of field complementary metal-oxide semiconductor (CMOS) field effect transistors (FETs) is a consequence of their operation. While efforts have been made to minimize the degradation, circuits are still degraded by a significant and measurable amount in operation, and therefore prediction of the amount of degradation which will occur during the expected lifetime of a device is still needed.

Bias-temperature instability (BTI) produces increases in the threshold voltage of a semiconductor device and therefore reduces the drain current of the device. The progression of BTI degradation is determined by total power-on time of the device and is a result of charge carriers tunneling through barriers and damaging the material along interfaces. For example, in some devices, such as p-type FETs, BTI degrades the conducting channel-to-dielectric interface, creating interface traps that reduce transistor performance. A second degradation mechanism is hot-carrier injection (HCI). In contrast to BTI, HCI degradation is controlled by switching the device's state. HCI is caused by "hot" electrons that have enough energy to interact with the gate dielectric. In both cases, BTI and HCI cause physical damage to the device and will eventually change the properties of the device. Both types of degradation occur naturally during operation of the devices at normal conditions, and can be made to occur more rapidly by raising the temperature and voltages applied to the devices. Application of voltage which results in device degradation is commonly referred to as "stress."

The degradation of individual FETs results in reduced propagation speed in logic circuits. Hence, ring oscillators (ROs) are often used to measure and predict the degradation, as such degradation results in a reduction of the RO frequency. However, the net frequency reduction does not reveal which particular transistors (e.g., n-type or p-type FETs) in a circuit have aged the most, nor does it reveal what the changes in their characteristics are, nor whether the mechanism is predominately reverse bias-temperature instability (BTI) or hot carrier injection (HCI) damage.

SUMMARY

A test oscillator includes multiple oscillator stages, with each stage having a delay stage and one or more fan-out devices to simulate a load, and a test stage that includes a delay stage and a test device having an input terminal for measuring one or more electrical properties of the test device. The plurality of oscillator stages and the test stage are arranged linearly, with a final stage feeding back into a first stage to provide oscillation.

A method of measuring degradation includes measuring an initial electrical characteristic of a test device in a ring oscillator that includes multiple oscillator stages, each having a delay stage and one or more fan-out devices, and a test stage having a delay stage and the test device. The ring oscillator is operated for a period of time. The electrical characteristic of the test device is measured after operating the ring oscillator. A level of degradation in the test device is determined using a processor based on the measurements of the electrical characteristic of the test device.

A system for measuring degradation includes a test device interface configured to measuring an initial electrical characteristic of a test device in a ring oscillator that comprises a plurality of oscillator stages and a test stage. Each oscillator stage has a delay stage and one or more fan-out devices. The test stage has a delay stage and the test device. The test device interface operates the ring oscillator for a period of time and measures the electrical characteristic of the test device after operating the ring oscillator. An analysis module comprising a processor configured to determine a level of degradation in the test device using a processor based on the measurements of the electrical characteristic of the test device.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present principles measure individual device characteristics in a degraded ring oscillator or delay chain. By replacing a fan out device on one stage of the ring oscillator or delay chain with a test device and access point, the test device experiences the same gate signal as the circuit elements, but its individual characteristics (such as drain current and threshold voltage) can be measured. The test device can be n-type field effect transistors (FETs) or p-type FETs, and can be subjected to bias temperature instability (BTI) stress only, or to a combination of BTI and hot carrier injection (HCI) stress. The biases applied to the source and drain terminals of the FETs determine if the gate voltage induces BTI stress or HCI stress or both. BTI stress occurs when the FET gate is biased with respect to its source and drain, while HCI stress can only occur if the source and drain are at different potentials, allowing channel current to flow.

Figure 1:
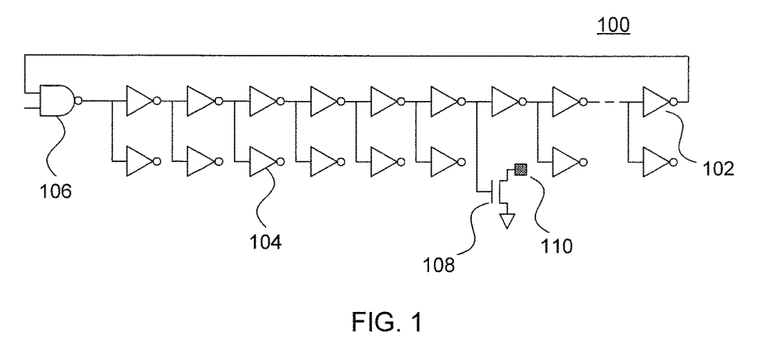
FIG. 1 is a diagram of a degradation test circuit in accordance with the present principles.

Referring now to the drawings in which like numerals represent the same or similar elements and initially to FIG. 1, a test ring oscillator 100 is shown. The test ring oscillator 100 is formed from a set of devices 102, shown herein as inverters, each of which inverts its input signal, providing a logical "not" operation. The devices 102 each introduce a characteristic delay to the signal, as it takes time for the signal to propagate through the device, with the period of one ring oscillation being twice the sum of the delays for each of the constituent devices 102. An enable switch 106 is formed using a NAND gate, allowing the ring oscillator to be turned off and on as needed. As a general matter, the ring oscillators described herein should be understood to as having an odd number of inverters in the chain, such that the output single switches on each oscillation.

In addition to the delay devices 102, there are fan out devices 104 as well. The fan out devices 104 act as a load on the ring oscillator 100, to simulate the loading effect which occurs in a computing circuit, and multiple fan out devices 104 may be used at a single branch. In most cases the fan out devices 104 have a floating output and are not connected to anything, but in some cases the fan out devices 104 are connected to power or ground terminals. According to the present embodiments, however, one or more fan out device may be replaced by a test device 108. The test device 108 receives the same gate signal as the delay devices 102, but its individual characteristics, such as drain current or threshold voltage, can be measured at an access terminal 110. Thus the test device 108 undergoes the same gate bias stresses as the delay devices 102 and can be used to simulate the stresses undergone by other, similar on-chip devices.

The signal to the enable switch 106 is set high to permit oscillation. When the signal is set low, the oscillation stops. At this time, a voltage supply for the circuit can be varied, thereby varying the voltage on the gate terminal of the test device. During the measurement, a curve of drain current and gate voltage is created, from which the threshold voltage and the drain current at saturation can be measured. By measuring these quantities before and after the ring oscillator 100 is activated, a change in the parameters can be measured.

Figure 2:
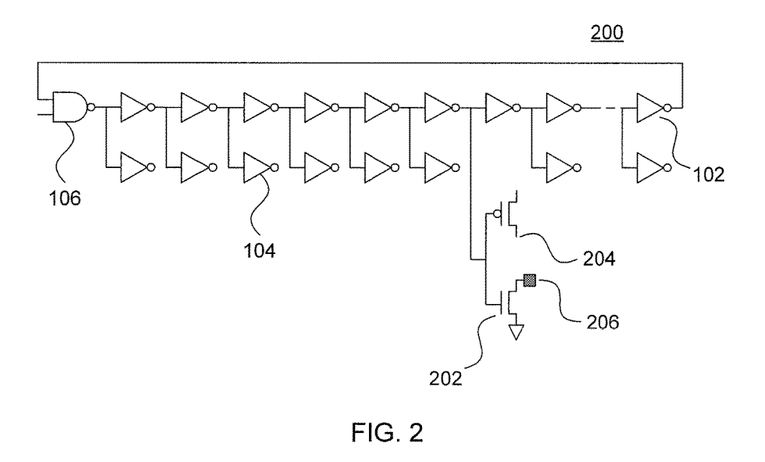
FIG. 2 is a diagram of a degradation test circuit in accordance with the present principles.

Referring now to FIG. 2, a measurement circuit 200 for alternating current (AC) BTI stress for an n-type FET is shown. In this case, the test ring oscillator 200 uses two devices in the fan out position—an n-type FET 202 and a p-type FET 204. These are the component FETs of the inverters in the ring oscillator. The n-type FET 202 is configured as the test device and has an access point 206. If the drain and source voltages of the test device are the same, then no current flows, so the test device 202 experiences only BTI stress on every other cycle of the ring oscillator. Thus the test voltage at the access point 206 is zero during operation to provide stress and is set to some circuit voltage during measurement. For example, the test voltage is set high, while the voltage of the ring oscillator is varied from the value of the test voltage to zero, Referring now to FIG. 3, a measurement circuit 300 for AC BTI stress for a p-type FET is shown. Similar to the layout of the test circuit for AC BTI stress for n-type FETs, discussed above with respect to FIG. 2, two devices are used in the fan out position, an n-type FET 302 and a p-type FET 304. In this case, the p-type FET 304 is configured as the test device with a voltage source 306 and a test access point 308. The voltage at the access point 308 is maintained at the same voltage as 306 during operation to provide stress, and is changed to zero during measurement.

Figure 3:
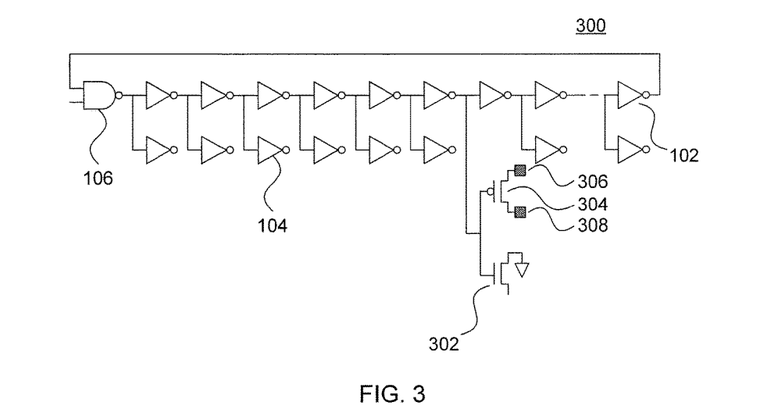
FIG. 3 is a diagram of a degradation test circuit in accordance with the present principles.

It should be noted that the n-type FET test circuit 200 uses one contact 206, while the p-type FET test circuit 300 uses two contacts 306 and 308. The source terminal of the n-type FET is tied to ground, while the source terminal of the p-type FET is tied to a stress voltage. These two embodiments may be combined, using access points to test both FETs.

Figure 4:
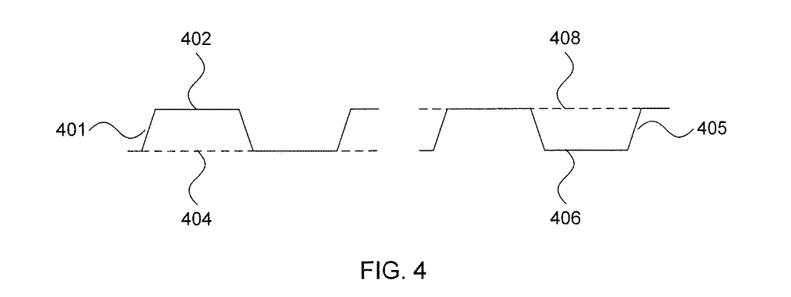
FIG. 4 is a diagram of degradation test waveforms in accordance with the present principles.

Referring now to FIG. 4, diagram of the gate and drain voltages of the test device in FIGS. 2 and 3 are shown. A first diagram 401 shows voltages for an n-type FET arrangement as in FIG. 2, where a gate voltage is shown as a solid line 402 and is seen to be alternating. The frequency of alternation is caused by the oscillation of ring 200. The drain voltage 404, meanwhile, is shown as a dashed line and remains constant that is biased low. As noted above, BTI is only produced when the gate of the test device is biased with respect to its drain, such that BTI stress is only applied during the cycles when the gate voltage 402 differs from the drain voltage 404. The second diagram 405 shows voltages for a p-type FET arrangement as in FIG. 3. In this case, the gate voltage 406 still oscillates, while the drain voltage 408 is biased high. As with the n-type FET signals 401, the ring 300 only produces BTI when the two signals 406 and 408 are different.

Figure 5:
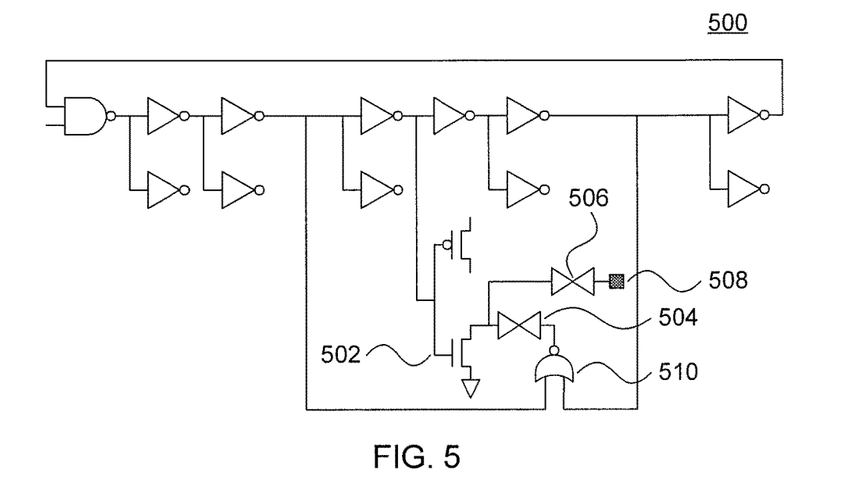
FIG. 5 is a diagram of a degradation test circuit in accordance with the present principles.

Referring now to FIG. 5, a measurement circuit 500 for inverter-like BTI stress for an n-type FET is shown. As before, one fan out device is replaced with a test circuit 502. In the case shown, an n-type FET is tested. Signals are drawn from before and after the test device and combined at NOR gate 510 to shift the drain signal on the test device 502. Two switches, 504 and 506, control whether the test device 502 is in an operation/stress mode or in a measurement mode. During stress/operation mode, the first switch 504 is closed and the second switch 506 is open. During measurement, the first switch 504 is open and the second switch 506 is closed, providing access by access point 508. A measurement voltage is applied to 508, and the voltage of the ring oscillator is varied to obtain an IV curve.

Figure 6:
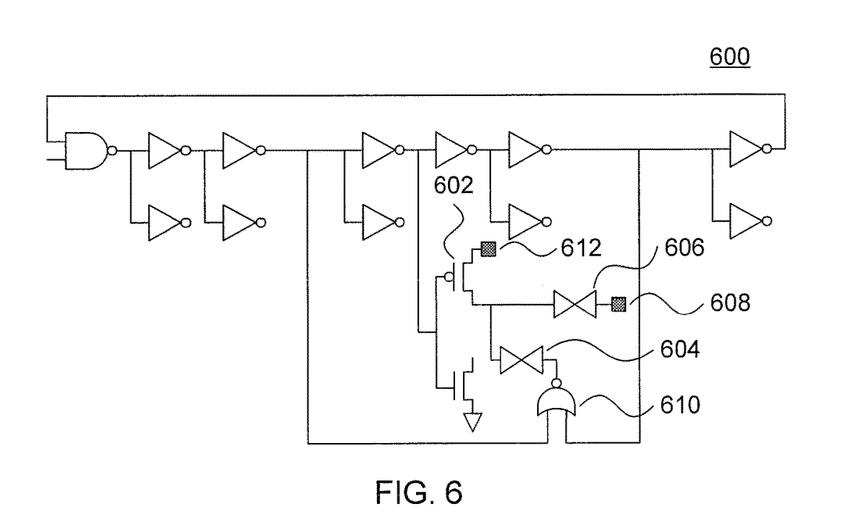
FIG. 6 is a diagram of a degradation test circuit in accordance with the present principles.

Referring now to FIG. 6, a measurement circuit 600 for inverter-like BTI stress for a p-type FET is shown. In this case, a p-type FET is used as the test device 602. Again, signals are drawn from before and after the test device and combined at the NOR gate 610 to shift the drain signal on the device during operation. The two switches, 604 and 606, control whether the test device 602 is in an operation/stress mode or in a measurement mode. During stress/operation mode, the first switch 604 is closed and the second switch 606 is open. During measurement, the first switch 604 is open and the second switch 606 is closed, providing access by access point 608.

Figure 7:
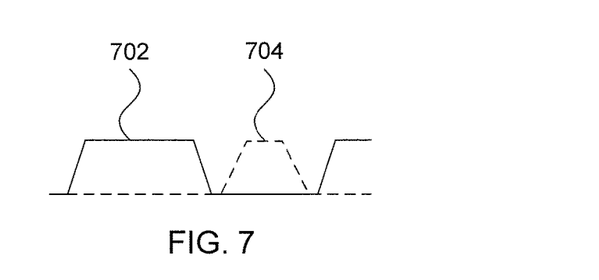
FIG. 7 is a diagram of degradation test waveforms in accordance with the present principles.

Referring now to FIG. 7, a diagram of the gate and drain voltages of the test device in FIGS. 5 and 6 (regardless of whether it is p-type or n-type) is shown. A gate voltage is shown as a solid line 702 and is seen to be alternating. The frequency of alternation matches the frequency of the oscillator ring 500 or 600. The drain voltage 704, meanwhile, is a NOR combination of an early and late signal from the ring, such that the drain voltage will only be high if the early and late signal are both low. This prevents overlap of the drain and gate signals—neither will be high if the other is high. This produces a stress similar to that of an inverter in a circuit, where the gate will always be biased in the reverse direction from the drain, but without the HCI because current does not flow. As noted above, BTI is only produced when the gate of the test device is biased with respect to its drain, such that BTI stress is applied during when the gate voltage is high.

Figure 8:
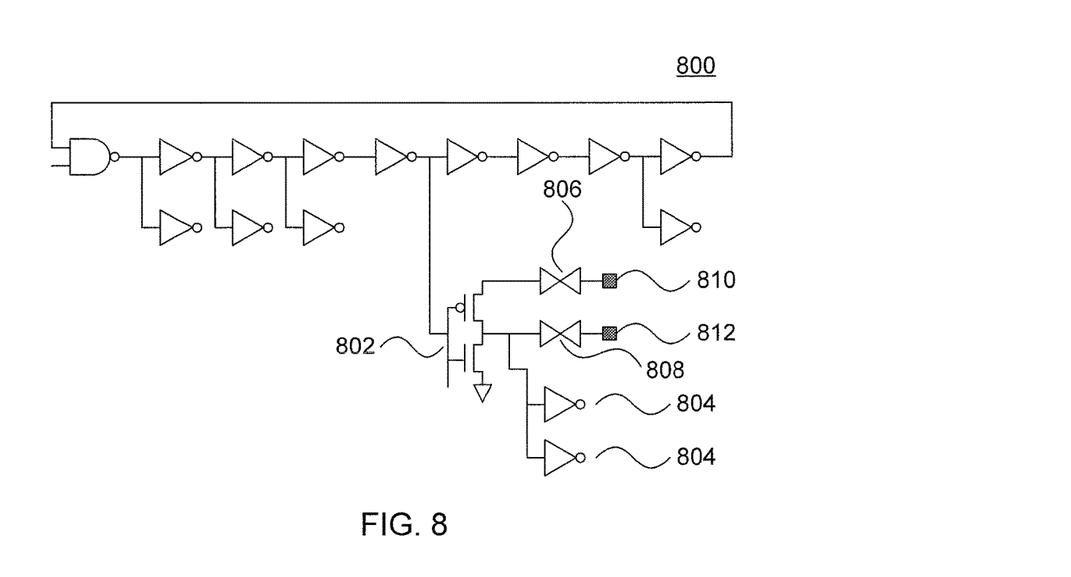
FIG. 8 is a diagram of a degradation test circuit in accordance with the present principles.

Referring now to FIG. 8, a measurement circuit 800 for HCI and BTI stress for both p-type FETs and n-type FETs 802 is shown. In this case, the biases applied to the source and drain terminals can be made to be the same as in a switching circuit. Currents can therefore flow, such that the FETs 802 experience both BTI stress and HCI stress. During ring oscillator stress and operation, switch 806 is closed and switch 808 is open. During measurement of the nFET, switch 806 is open, switch 808 is closed, and a measurement voltage is applied to 812. During measurement of the pFET, switch 806 is closed, switch 808 is closed, the voltage of 810 is set to zero, and the voltage of 812 is set to a measurement voltage. This embodiment uses additional fan-out devices 804 to mimic the full stress conditions.

Figure 9:
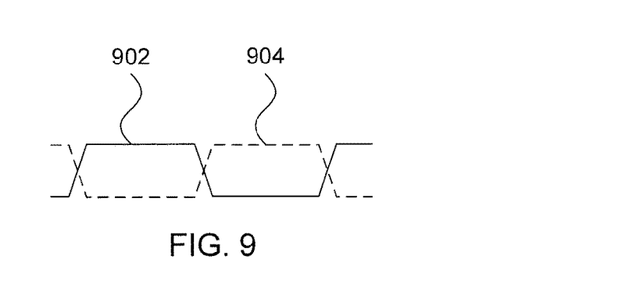
FIG. 9 is a diagram of degradation test waveforms in accordance with the present principles.

Referring now to FIG. 9, a diagram of the gate and drain voltages of the test device in FIG. 8 is shown. A gate voltage is shown as a solid line 902 and is seen to be alternating. The frequency of alternation is caused by the oscillation of ring 800. The drain voltage 904, meanwhile, is 180 degrees out of phase with the gate voltage 902. This embodiment therefore obtains information regarding both HCI and BTI degradation. One of these two forms of degradation can be isolated by subtracting out the other's contribution using degradation measurements from another source (e.g., devices 500 or 600).

Figure 10:
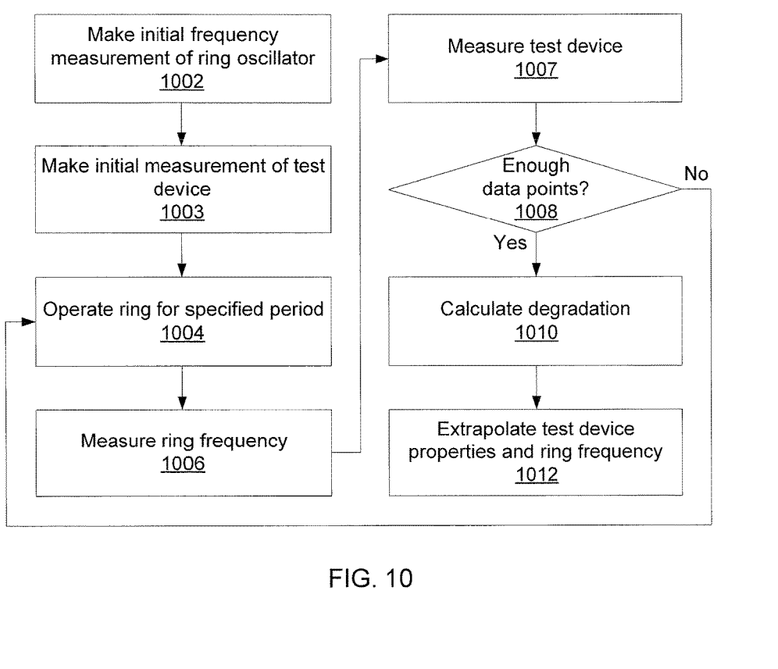
FIG. 10 is a block/flow diagram of a method of measuring degradation in accordance with the present principles.

Referring now to FIG. 10, a method for measuring degradation is shown. Block 1002 makes an initial estimation of a ring oscillator frequency as described above. Block 1003 then measures a characteristic of a test device. The measurement captures some property of a test device in the ring oscillator, such as, e.g., threshold voltage. The measurement includes applying a measurement voltage to a test terminal of the test device, and a measurement of the current through the test terminal is made. The gate voltage of the device is controlled by an input voltage of the ring oscillator, so that the midpoint of an inverter will take the value of the input voltage if it is in the "off" state.

Block 1004 then operates the ring for a specified period of time and block 1006 performs a measurement of the ring frequency as described above. Block 1007 perforins an additional measurement of the test device. If enough data points have been found at block 1008, block 1010 compares the measured value of the device to the initial measurement to determine how much the device has degraded. This degradation will reflect the amount of degradation suffered by similar devices on the chip that have endured similar conditions. Block 1012 extrapolates the oscillator frequency and device characteristics. If sufficient measurements have not been made, processing returns to block 1004 while the ring operates for the specified period of time.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 11:
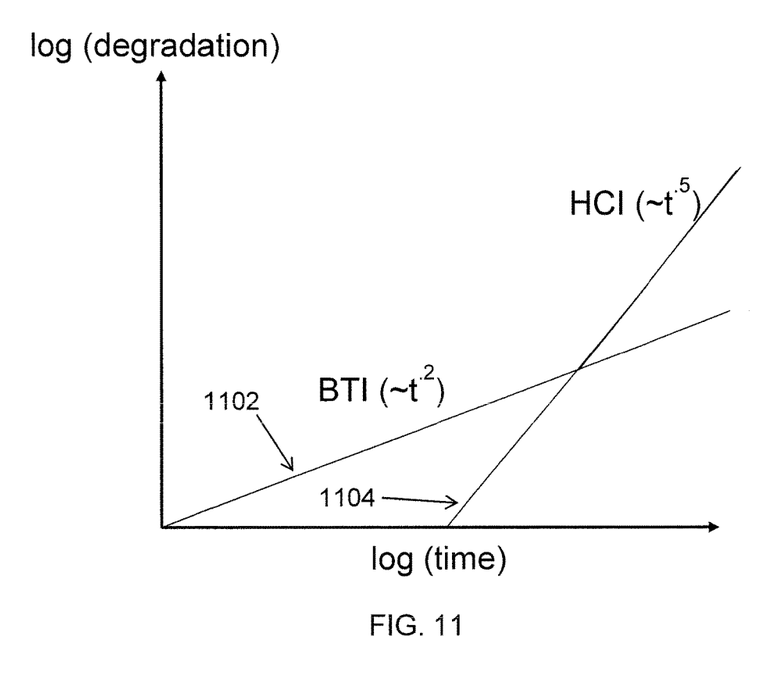
FIG. 11 is a graph comparing HCI degradation and BTI degradation in accordance with the present principles.

Referring now to FIG. 11, a relationship between degradation and time is shown for both BTI and HCI. Each follows a power law model, where the degradation goes as $At^n$, where A is a function of voltage and temperature, t is time, and n is a power factor that is independent of both voltage and temperature. Block 1212 maps measurements of the degradation along a curve such as those depicted in FIG. 11 and fits a curve to the available data according to the above functional form, using existing measurements to determine the parameters A and n such that predictions of future degradation values can be made. In this case, BTI degradation 1102 is shown having a value of n of about 0.2, while HCI degradation 1104 is shown having a value of n of about 0.5.

Figure 12:
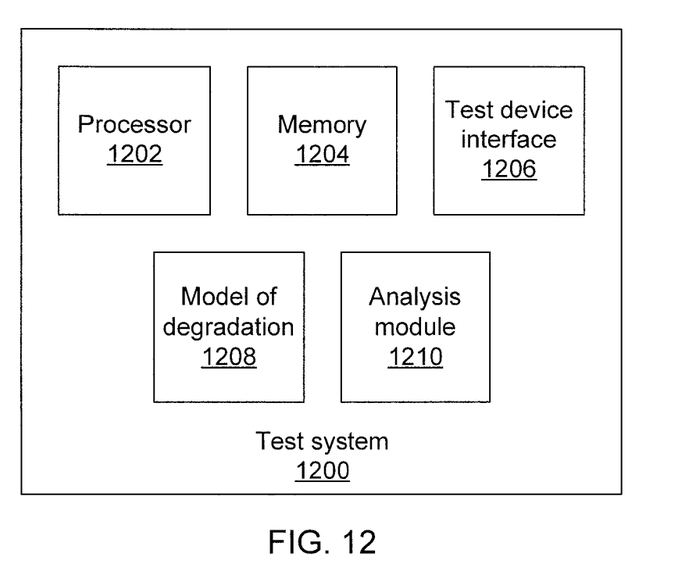
FIG. 12 is a block diagram of a test system for measuring degradation in accordance with the present principles.

Referring now to FIG. 12, a system 1200 for testing circuit degradation is shown. The system 1200 includes a hardware processor 1202 and a memory 1204. It should be noted that modules of the system 1200 may be implemented software on the processor 1202 and stored in memory 1204, but these modules may also be implemented as hardware in the form of, for example, an application-specific integrated chip or a field-programmable gate array. The system 1200 further includes a test device interface 1206 which includes connections to one or more on-chip test devices as described above. The test device interface 1206 measures such device characteristics as ring oscillator frequency and test device voltage threshold and furthermore controls the operation of the test oscillators to provide stress. The memory 1204 stores a model of degradation 1208 that reflects the functional form of the degradation of a device according to, e.g., HCI and BTI.

Analysis module 1210 collects measurements of a device under test from the test device interface 1206 and uses them to determine a current level of degradation in the device(s) and to update the model of degradation 1208. Based on the model of degradation 1208, the analysis module 1210 can extrapolate degradation in the device(s) to form predictions as to future levels of degradation.

Having described preferred embodiments of measuring individual device degradation in CMOS circuits (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A test oscillator, comprising:
a plurality of oscillator stages, with each stage comprising a delay stage and one or more fan-out devices to simulate a load; and
a test stage, comprising a delay stage and a test device having an input terminal connected to a source or drain of a transistor of the test device, for measuring one or more electrical properties of the test device, wherein the plurality of oscillator stages and the test stage are arranged linearly, with a final stage feeding back into a first stage to provide oscillation.

2. The test oscillator of claim 1, further comprising an enable switch configured to receive the output of the final stage and to provide the output as an input to the final stage if an enable signal is present.

3. The test oscillator of claim 1, wherein the delay stages are inverters.

4. The test oscillator of claim 1, wherein the fan-out devices are inverters.

5. The test oscillator of claim 4, wherein the fan-out devices have a floating output.

6. The test oscillator of claim 1, wherein the test device comprises a p-type field effect transistor and an n-type field effect transistor.

7. The test oscillator of claim 6, wherein one of the field effect transistors of the test device has a gate input that is biased in a reverse direction from a drain input during operation.

8. The test oscillator of claim 6, wherein both field effect transistors are stressed during operation.

9. A method of measuring degradation, comprising:
measuring an initial electrical characteristic of a test device in a ring oscillator that comprises a plurality of oscillator stages, each having a delay stage and one or more fan-out devices, and a test stage having a delay stage and the test device;
operating the ring oscillator for a period of time;
measuring the electrical characteristic of the test device after operating the ring oscillator; and
determining a level of degradation in the test device using a processor based on the measurements of the electrical characteristic of the test device.

10. The method of claim 9, further repeating said steps of operating the ring oscillator and measuring the electrical characteristic of the test device multiple times before determining the level of degradation.

11. The method of claim 10, further comprising fitting a curve to the measurements of the electrical characteristic of the test device.

12. The method of claim 11, further comprising extrapolating the measurements of the electrical characteristic of the test device into the future using the curve.

13. The method of claim 11, wherein the curve has a functional form of $At^n$, where A is a parameter that is a function of voltage and temperature, t is time, and n is a power factor that characterizes a type of degradation.

14. The method of claim 9, further comprising:
measuring an initial frequency of the ring oscillator; and
measuring the frequency of the ring oscillator after operating the ring oscillator.

15. A system for measuring degradation, comprising:
a test device interface configured to measuring an initial electrical characteristic of a test device in a ring oscillator that comprises a plurality of oscillator stages, each having a delay stage and one or more fan-out devices, and a test stage having a delay stage and the test device, to operate the ring oscillator for a period of time, and to measure the electrical characteristic of the test device after operating the ring oscillator; and
an analysis module comprising a processor configured to determine a level of degradation in the test device using a processor based on the measurements of the electrical characteristic of the test device.

16. The system of claim 15, wherein the test device interface is further configured to repeat operation of the ring oscillator and measurement of the electrical characteristic of the test device multiple times before determining the level of degradation.

17. The system of claim 16, wherein the analysis module is further configured to fit a curve to the measurements of the electrical characteristic of the test device.

18. The system of claim 17, wherein the analysis module is further configured to extrapolate the measurements of the electrical characteristic of the test device into the future using the curve.

19. The system of claim 17, wherein the curve has a functional form of $At^n$, where A is a parameter that is a function of voltage and temperature, t is time, and n is a power factor that characterizes a type of degradation.

20. The system of claim 15, wherein the test device interface is further configured to measure an initial frequency of the ring oscillator and to measure the frequency of the ring oscillator after operating the ring oscillator.

* * * * *